United States Patent
Linliu

(10) Patent No.: US 6,287,957 B1
(45) Date of Patent: Sep. 11, 2001

(54) SELF-ALIGNED CONTACT PROCESS

(75) Inventor: Kung Linliu, Hsinchu (TW)

(73) Assignee: Worldwide Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/468,196

(22) Filed: Dec. 21, 1999

(30) Foreign Application Priority Data

Oct. 7, 1999 (TW) ................................................ 88117289

(51) Int. Cl.$^7$ ................................................ H01L 21/4763
(52) U.S. Cl. .................... 438/634; 438/584; 438/631; 438/639; 438/643
(58) Field of Search .................................. 438/631, 639, 438/643, 584, 634

(56) References Cited

U.S. PATENT DOCUMENTS 6,146,997 * 11/2000 Liu et al. .............................. 438/639

\* cited by examiner

Primary Examiner—Charles Bowers
Assistant Examiner—Lisa Kilday
(74) Attorney, Agent, or Firm—Fish & Richardson P.C.

(57) ABSTRACT

The present invention discloses a method for forming a self-aligned contact hole, which provides a large process window and ensures full utilization of bottom contact area even when the overlay is not well aligned. The method comprises the steps of (a) providing a semiconductor substrate having a gate electrode and a diffusion region thereon; (b) forming a conformal layer of etch barrier material overlying the substrate surface including the diffusion region and the upper surface and the sidewalls of the gate electrode; (c) forming an insulating layer overlying the barrier layer; (d) forming a mask layer overlying the insulating layer; (e) etching an opening through the mask layer and part of the way through the insulating layer, aligned with the diffusion region, until the barrier layer is exposed; (f) forming spacers on the sidewalls of the opening; (g) removing the remaining portion of the insulating layer underneath the opening by isotropically etching using mask layer, spacers and barrier layer as stopping layers; and (h) removing the barrier layer underneath the opening, thereby exposing the diffusion region.

27 Claims, 5 Drawing Sheets

SELF-ALIGNED CONTACT PROCESS

BACKGROUND OF THE INVENTION

1. Field of the Invention

The present invention relates in general to the fabrication of semiconductor devices. More particularly, it relates to a self-aligned contact process which can provide a large process window for stable high yield in mass production.

2. Description of the Related Arts

Self-alignment is a technique in which multiple levels of regions on the wafer are formed using a single mask, thereby eliminating the alignment tolerance required by additional masks. This powerful approach is being used more often as circuit sizes decrease. Self-aligned contacts are often used in memory cells where contacts are limited only by the spacers and field oxide bird's beak or a contact window landing pad. Therefore, the mask contact window can be oversized relative to the contact area underneath, and no contact borders are needed, resulting in significant space saving. Referring to FIGS. 1A–1C, a conventional process of forming a self-aligned contact hole is illustrated in cross-sectional views. The process will be described as follows.

FIG. 1A shows a semiconductor substrate 10 having two closely spaced field effect transistors with gate electrodes 14, source/drain diffusion regions 18, and gate oxides 12. The gate electrodes 14, commonly consisting of polysilicon and silicide, are capped with an insulator 16 of silicon nitride. Next, a nitride or oxide layer is formed over the substrate surface using low pressure chemical vapor deposition (LPCVD), which is then anisotropically etched to form sidewall spacers 22 on the sidewalls of the gate electrodes 14 and the cap layers 16.

Referring to FIG. 1B, a conformal layer of etch barrier material 24 is deposited over the diffusion region 18, the cap layers 16, and the sidewall spacers 22. The barrier layer 24, which may also be called the liner layer, typically consists of silicon nitride. A layer of insulator 26 is deposited over the substrate as inter-layer dielectric (ILD) and is preferably planarized. The insulating layer 26 may consist of one or more dielectric depositions of spin on glass (SOG), silicon oxide, borophosphosilicate (BPSG), and so on.

Referring to FIG. 1C, using a photoresist mask 28, a contact hole can be etched in the insulating layer 26 with the liner layer 24 serving as an etch stop, which will be finally removed to expose the diffusion region 18. The etching of the insulating layer 26 is selective to the capping layers 16 and sidewall spacers 22 encapsulating the gate electrodes 14 so that the contact hole is self-aligning in nature.

However, as the semiconductor fabricating technology moves into deep sub-micron, it is increasingly recognized that the present technology for making self-aligned contact may be inadequate. The process window is not large enough for providing stable high yield in mass production.

Even though the process window can be improved by increasing the etch selectivity, the highest selectivity of oxide to nitride is only about 30–40 with the current dry etch technology, and the higher the selectivity, the more tapered the contact sidewall profile, as depicted by dotted lines 30 in FIG. 3C. Such a tapered profile causes a significant decrease in the contact area to the substrate, and consequently, increasing the contact resistance.

In consequence, it would be a significant improvement in the state of the art if the process window could be improved by a higher etch selectivity while increasing the contact area simultaneously.

SUMMARY OF THE INVENTION

It is therefore an object of the invention to provide a self-aligned contact process where the process window is large enough for stable high yield in mass production.

It is another object of the invention to provide a self-aligned contact process which provides a larger process window as well as a larger contact area as compared to the conventional process.

It is further object of the invention to provide a self-aligned contact process which ensures full utilization of the bottom contact area even when the overlay is not well aligned.

To accomplish the above objectives, the present invention provides a method for forming a self-aligned contact hole, characterized in that the bottom portion of the contact hole is formed by wet etch methods to ensure high selectivity. The present method for forming a self-aligned contact includes the steps of: (a) providing a semiconductor substrate having a gate electrode and a diffusion region thereon; (b) forming a conformal layer of etch barrier material overlying the substrate surface including the diffusion region and the upper surface and the sidewalls of the gate electrode; (c) forming an insulating layer overlying the barrier layer; (d) forming a mask layer overlying the insulating layer; (e) etching an opening through the mask layer and part of the way through the insulating layer, aligned with the diffusion region, until the barrier layer is exposed; (f) forming spacers on the sidewalls of the opening; (g) removing the remaining portion of the insulating layer underneath the opening by isotropically etching using the mask layer, the spacers and the barrier layer as stopping layers; and (h) removing the barrier layer underneath the opening, thereby exposing the diffusion region.

The isotropic etch of step (g) can be performed by immersion etching or spraying etching using HF solution or HF vapor as etchant. By using the wet etch methods, a selectivity of higher than 100 for oxide to nitride can be obtained.

Other objects, features, and advantages of the present invention will become apparent from the following detailed description which makes reference to the accompanying drawings.

DESCRIPTION OF THE PREFERRED EMBODIMENTS

Now in keeping with the objectives of this invention, the method for fabricating a self-aligned contact hole is described in detail.

Figure 1A:
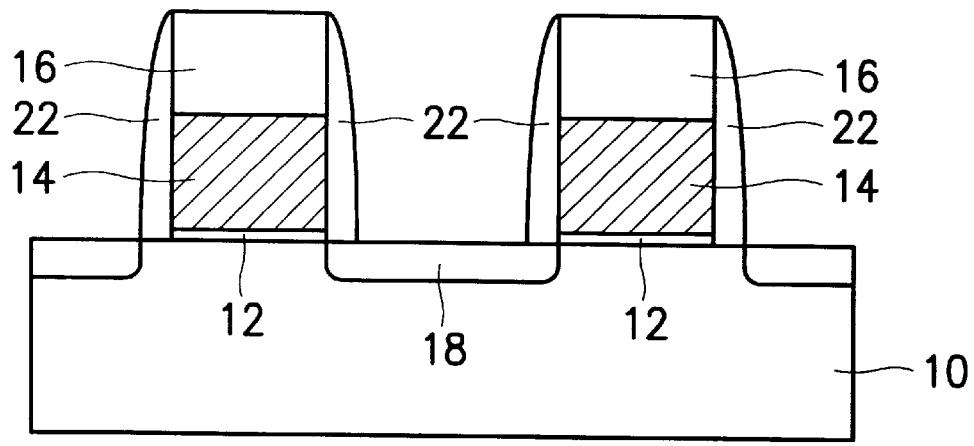
FIGS. 1A through 1C are cross-sectional views illustrating the steps of a conventional method for fabricating a self-aligned contact hole.
Figure 1B:
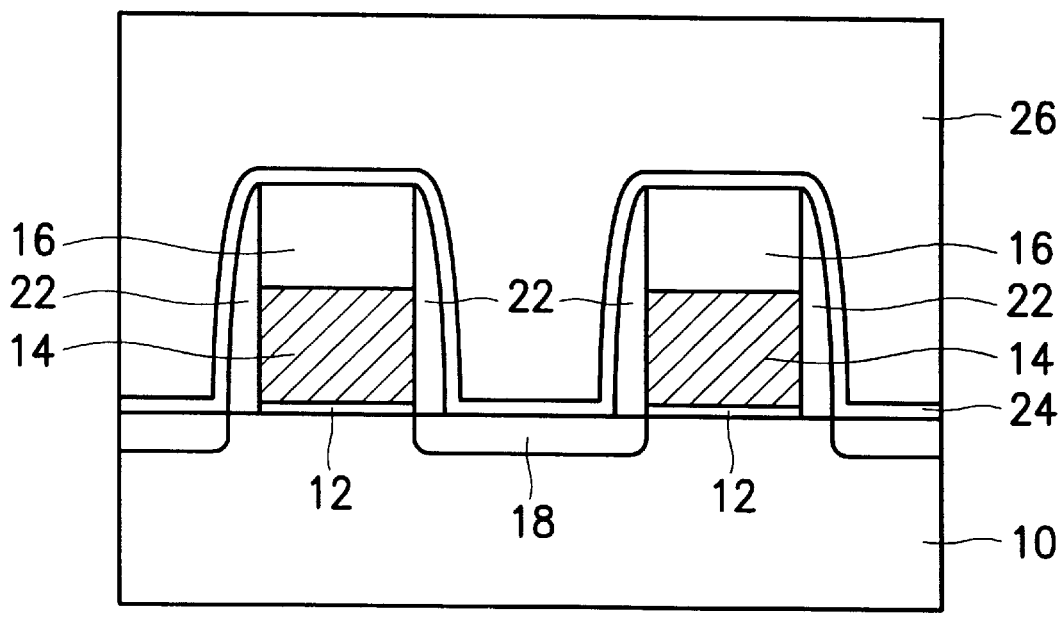
Figure 1C:
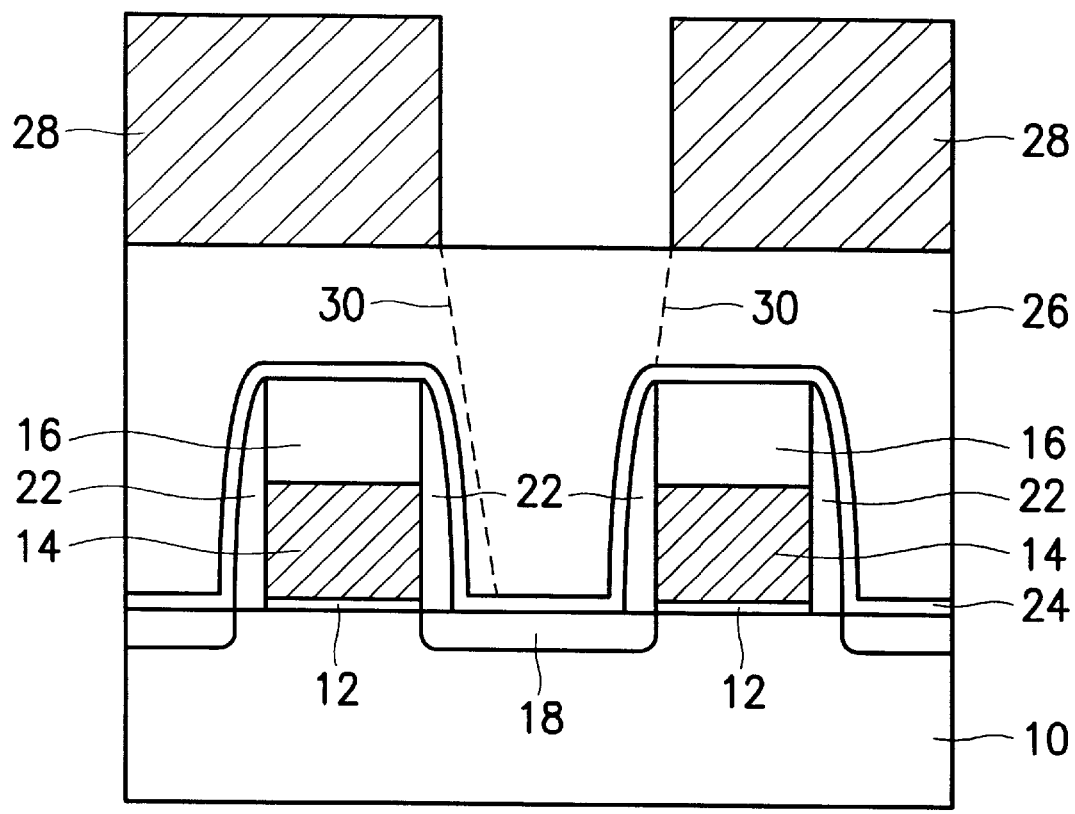
Figure 2A:
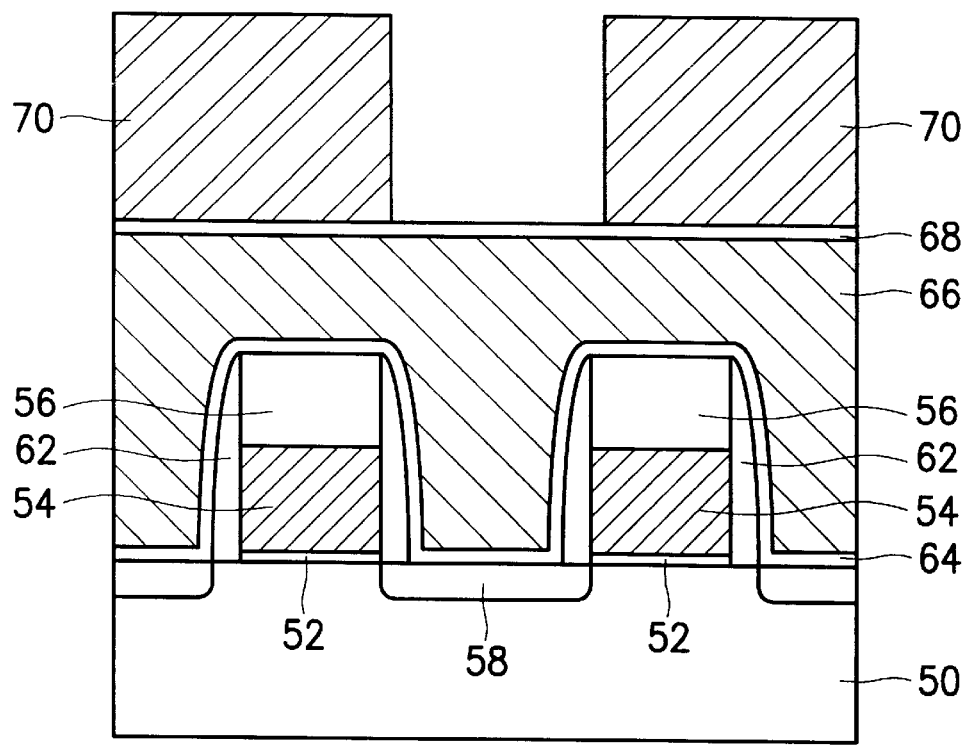
FIGS. 2A through 2E are cross-sectional views illustrating the steps for fabricating a self-aligned contact hole according to a preferred embodiment of the invention.

Referring to FIG. 2A, two closely spaced field effect transistors with gate electrodes 54, source/drain diffusion regions 58, and gate oxides 52 are defined in a semiconductor substrate 50 using known processes. The gate electrodes 54, preferably consisting of polysilicon and tungsten silicide, are capped with an insulator 56 of silicon nitride. The process details for forming such field effect transistors are well known and will not be described here. Next, insulating sidewall spacers 52 are formed on the sidewalls of the gate electrodes 64 and the cap layers 56. The sidewall spacers 52 can be formed by depositing a nitride or oxide layer using LPCVD, followed by anisotropically etching back.

Still referring to FIG. 2A, a conformal layer of etch barrier material 64 is deposited over the diffusion region 58, the cap layers 56, and the sidewall spacers 62. The barrier layer is typically a silicon nitride layer having a thickness of about 100 to 1000 Å. A layer of insulator 66 is deposited over the substrate as inter-layer dielectric (ILD) and is preferably planarized. The insulating layer 66 may consist of one or more dielectric depositions of spin on glass (SOG), silicon oxide, borophosphosilicate (BPSG), and so on. Next, a mask layer 68 is deposited over the insulating layer 66. The mask layer 68, for example, is a silicon nitride layer with a thickness of about 50 to 500 Å. After this, a photoresist layer 70 with a contact hole pattern aligned with the diffusion region 58 is formed over the mask layer 68 by microlithographic techniques.

Figure 2B:
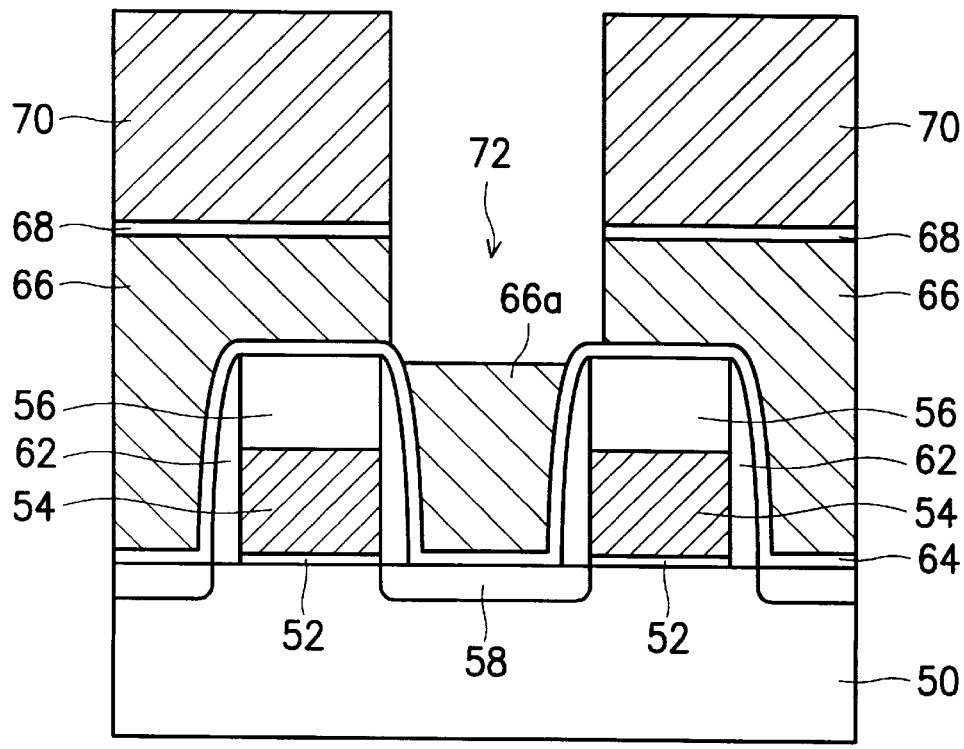

Referring to FIG. 2B, using the photoresist layer 70 as an etch mask, the contact hole pattern is anisotopically etched through the mask layer 68 and part of way through the insulating layer 66 until the barrier layer 64 is exposed. Thus, an opening 72 in alignment with the diffusion region 58 is formed in the upper portion of the insulating layer. It is preferable that this etch is stopped at the upper most portion of the barrier layer 64, which can be done by either end point detection or time mode control during the etching process. Note that there are insulator residues 66a in the opening yet.

Figure 2C:
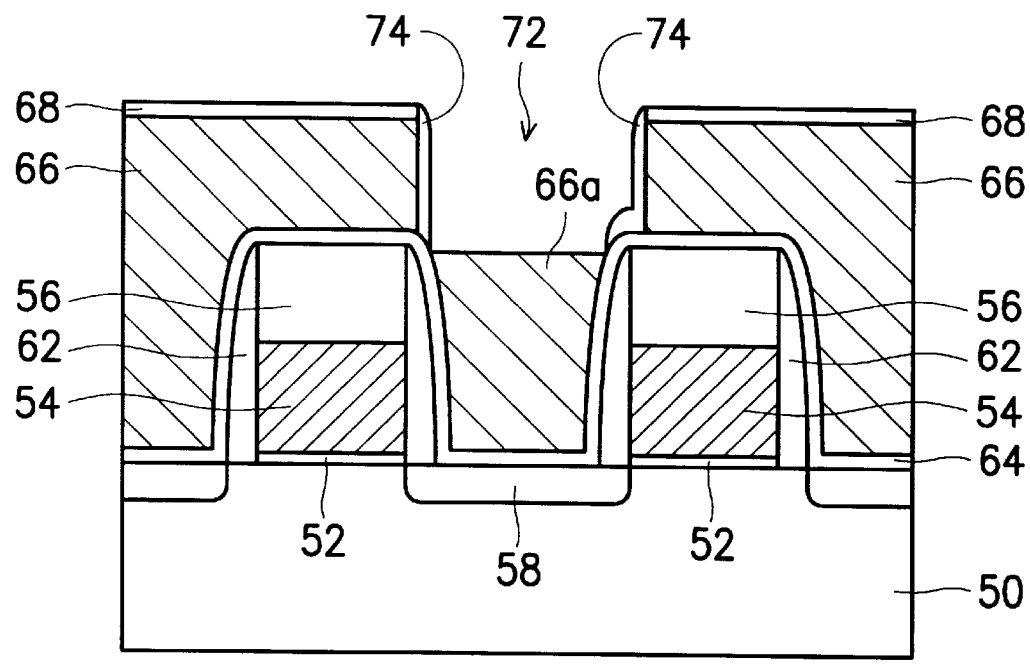

Referring to FIG. 2C, after removing the photoresist layer 70 in accordance with methods well known in the art, spacers of etch barrier material 74 are formed on the sidewalls of the opening 72. For example, the sidewall spacers 74 can be formed by depositing a conformal silicon nitride layer with a thickness of about 50 to 500 Å over the bottom and sidewalls of opening, followed by anisotropically etching back. As can be seen in FIG. 2C, the insulating layer is thus encapsulated by the mask layer 68 and the sidewall spacers 74 except the portion underneath the opening 72.

Figure 2D:
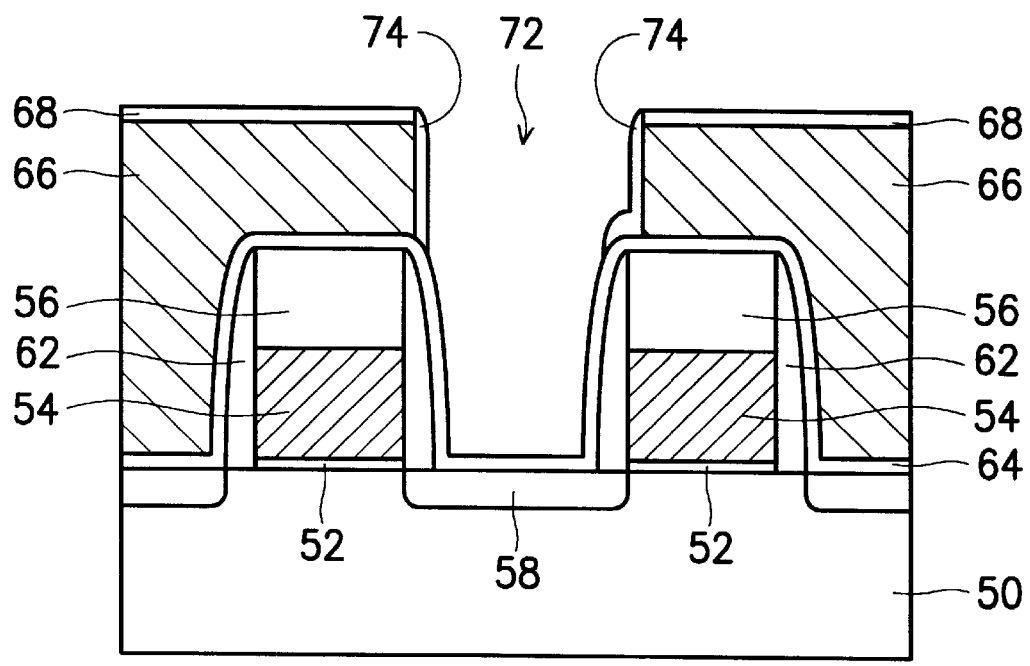

Referring to FIG. 2D, an isotropic wet etching is performed using the mask layer 68, the sidewall spacers 74 and the barrier layer 64 as stopping layers, thereby removing any insulator residues left behind in the opening in the previous etching process. During this etch, the mask layer 68 and sidewall spacers 74 serves as etch barriers to protect the insulating layer 66 from being attacked, while the barrier layer 66 protects the diffusion region 58. The isotropic etch can be performed by typical immersion etching or spraying etching using HF solution or HF vapor as etchant. By using these methods, a selectivity of higher than 100 for oxide to nitride can be achieved, much higher than that of dry etch methods (30–40). Moreover, owing to the isotropic feature of wet etching, the insulator residues in the contact region can be thoroughly removed even if there is misalignment during the microlithography process. Thus full utilization of the contact area is guaranteed, and the process window is significantly improved.

Figure 2E:
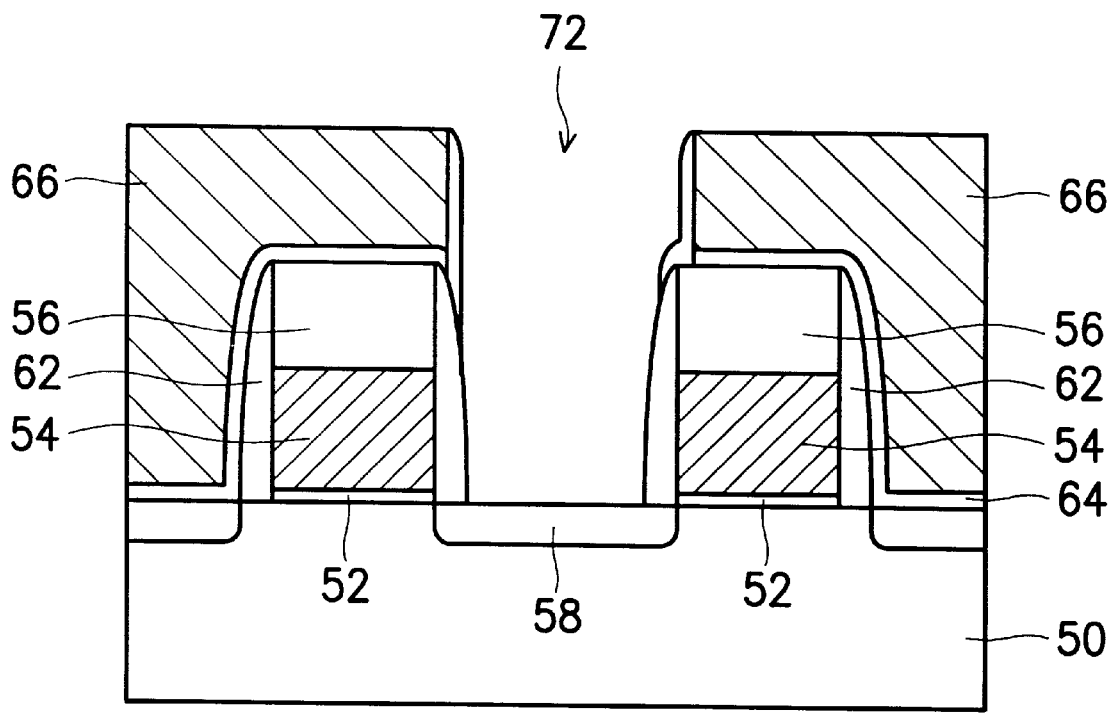

Referring to FIG. 2E, after removal of the insulator residues, the conformal barrier layer 64 underneath the opening is anisotropically etched to remove the portion over the diffusion region 58, thereby completing the contact hole. Simultaneously with this etch, the mask layer 68 overlying the insulating layer 66 is removed. Thereafter, a conductive plug can be formed in the contact hole 72 to electrically connect to the diffusion region 58.

By using this process, the application of wet etching instead of dry etching in contact hole etch gives a much higher selectivity. Further, full utilization of contact region is guaranteed even when the overlay is not well aligned. Finally, a larger process window for stable high yield in mass production is provided.

While the invention has been particularly shown and described with reference to the preferred embodiment thereof, it will be understood by those skilled in the art that various changes in form and details may be made without departing from the spirit and scope of the invention.

What is claimed is:

1. A method for forming a self-aligned contact hole, comprising the steps of:
   (a) providing a semiconductor substrate having a gate electrode and a diffusion region thereon;
   (b) forming a conformal layer of etch barrier material overlying the substrate surface including the diffusion region and the upper surface and the sidewalls of the gate electrode;
   (c) forming an insulating layer overlying the barrier layer;
   (d) forming a mask layer overlying the insulating layer;
   (e) etching an opening through the mask layer and part of the way through the insulating layer, aligned with the diffusion region, until the barrier layer is exposed;
   (f) forming spacers on the sidewalls of the opening;
   (g) removing the remaining portion of the insulating layer underneath the opening by isotropically etching using said mask layer, said spacers and said barrier layer as stopping layers; and
   (h) removing the barrier layer underneath the opening, thereby exposing the diffusion region.

2. The method as claimed in claim 1, wherein said gate electrode comprises a capping layer.

3. The method as claimed in claim 2, wherein said capping layer is a silicon nitride layer.

4. The method as claimed in claim 1, wherein said barrier layer is a silicon nitride layer.

5. The method as claimed in claim 1, wherein said mask layer is a silicon nitride layer.

6. The method as claimed in claim 1, wherein said spacers are silicon nitride spacers.

7. The method as claimed in claim 1, wherein said insulating layer comprises a layer of borophosphosilicate glass.

8. The method as claimed in claim 1, wherein said isotropic etching is carried out by immersion etching or spray etching.

9. The method as claimed in claim 1, wherein said isotropic etching is carried out using HF solution or HF vapor.

10. The method as claimed in claim 1, further comprising a step of forming a conductive plug in said opening to electrically connect to the diffusion region.

11. A method for forming a self-aligned contact hole, comprising the steps of:
    (a) providing a semiconductor substrate having a gate electrode and a diffusion region thereon;
    (b) forming a conformal layer of silicon nitride overlying the substrate surface including the diffusion region and the upper surface and the sidewalls of the gate electrode;
    (c) forming an insulating layer overlying the conformal layer of silicon nitride;

(d) forming a mask layer of silicon nitride overlying the insulating layer;

(e) etching an opening through the mask layer and part of the way through the insulating layer, aligned with the diffusion region, until the conformal layer is exposed;

(f) forming silicon nitride spacers on the sidewalls of the opening;

(g) removing the remaining portion of the insulating layer underneath the opening by isotropically etching using said mask layer, said spacers and said conformal layer as stopping layers; and (h) removing the conformal layer underneath the opening, thereby exposing the diffusion region.

12. The method as claimed in claim 11, wherein said gate electrode comprises a capping layer.

13. The method as claimed in claim 12, wherein said capping layer is a silicon nitride layer.

14. The method as claimed in claim 11, wherein said insulating layer comprises a layer of borophosphosilicate glass.

15. The method as claimed in claim 11, wherein said isotropic etching is carried out by immersion etching or spray etching.

16. The method as claimed in claim 11, wherein said isotropic etching is carried out using HF solution or HF vapor.

17. The method as claimed in claim 11, further comprising a step of forming a conductive plug in said opening to electrically connect to the diffusion region.

18. A method for forming a self-aligned contact hole, comprising the steps of:

(a) providing a semiconductor substrate having a gate electrode and a diffusion region thereon;

(b) forming a conformal layer of etch barrier material overlying the substrate surface including the diffusion region and the upper surface and the sidewalls of the gate electrode;

(c) forming an insulating layer overlying the barrier layer;

(d) forming a mask layer overlying the insulating layer;

(e) etching an opening, aligned with the diffusion region, through the mask layer and part of the way through the insulating layer until a portion of the barrier layer is exposed, the etching leaving a remaining portion of the insulating layer underneath the opening;

(f) forming spacers on the sidewalls of the opening;

(g) removing the remaining portion of the insulating layer by isotropically etching using said mask layer, said spacers and said barrier layer as stopping layers; and (h) removing the barrier layer underneath the opening, thereby exposing the diffusion region.

19. The method as claimed in claim 18, wherein said gate electrode comprises a capping layer.

20. The method as claimed in claim 19, wherein said capping layer is a silicon nitride layer.

21. The method as claimed in claim 18, wherein said barrier layer is a silicon nitride layer.

22. The method as claimed in claim 18, wherein said mask layer is a silicon nitride layer.

23. The method as claimed in claim 18, wherein said spacers are silicon nitride spacers.

24. The method as claimed in claim 18, wherein said insulating layer comprises a layer of borophosphosilicate glass.

25. The method as claimed in claim 18, wherein said isotropic etching is carried out by immersion etching or spray etching.

26. The method as claimed in claim 18, wherein said isotropic etching is carried out using HF solution or HF vapor.

27. The method as claimed in claim 18, further comprising a step of forming a conductive plug in said opening to electrically connect to the diffusion region.

* * * * *